United States Patent [19]

Hosaka

[11] Patent Number: 5,234,863
[45] Date of Patent: Aug. 10, 1993

[54] METHOD OF MANUFACTURING DOPED CONTACTS TO SEMICONDUCTOR DEVICES

[75] Inventor: Takashi Hosaka, Tokyo, Japan

[73] Assignee: Seiko Instruments Inc., Japan

[21] Appl. No.: 805,116

[22] Filed: Dec. 10, 1991

[30] Foreign Application Priority Data

Dec. 11, 1990 [JP] Japan ................................ 2-401388
Dec. 25, 1990 [JP] Japan ................................ 2-405757
Jul. 1, 1991 [JP] Japan ................................ 3-160578

[51] Int. Cl.$^5$ ........................................... H01L 21/283
[52] U.S. Cl. ..................................... 437/193; 437/195
[58] Field of Search ............... 437/191, 193, 187, 186, 437/162, 195

[56] References Cited

U.S. PATENT DOCUMENTS

| 4,433,468 | 2/1984 | Kawamata | 437/193 |
| 4,463,491 | 8/1984 | Goldman et al. | 437/162 |
| 4,714,686 | 12/1987 | Sander et al. | 437/195 |
| 4,727,045 | 2/1988 | Cheung et al. | 437/47 |

FOREIGN PATENT DOCUMENTS

| 57-93548 | 6/1982 | Japan | 437/193 |
| 1-243526 | 9/1989 | Japan | 437/193 |
| 1-305517 | 12/1989 | Japan | 437/193 |

OTHER PUBLICATIONS

Wolf, S., et al., Silicon Processing, 1986, Lattice Press, vol. 1, pp. 175-182.

Primary Examiner—T. N. Quach
Attorney, Agent, or Firm—Bruce L. Adams; Van C. Wilks

[57] ABSTRACT

The present invention relates to a method of forming contacts in contact holes used in the semiconductor devices. The object of the present invention is to flatten the contacts to contact holes of a size smaller than 1 μm in order to decrease the contact resistance in the contact holes. After a contact hole is formed on an P+ diffused layer, a polycrystalline (or amorphous) silicon film containing P-type impurities is formed by a chemical vapor-phase deposition method to fill the contact hole. Then, the contact hole only is filled with the polycrystalline silicon film by an etch-back method. Contact to an N+ diffused layer is subsequently formed in the same manner using a silicon film containing N-type impurities, followed by an upper wiring. Since polycrystalline silicon film is formed by the vapor-phase deposition method maintaining good step-covering property, the contact hole is sufficiently filled. The polycrystalline silicon film containing impurities in a high concentration makes it possible to lower the contact resistance in the contact holes.

16 Claims, 7 Drawing Sheets

METHOD OF MANUFACTURING DOPED CONTACTS TO SEMICONDUCTOR DEVICES

BACKGROUND OF THE INVENTION (1) Field of the Invention

The present invention relates to a method of forming contact holes used in semiconductor devices.

(2) Description of the Related Art

Figure 3:
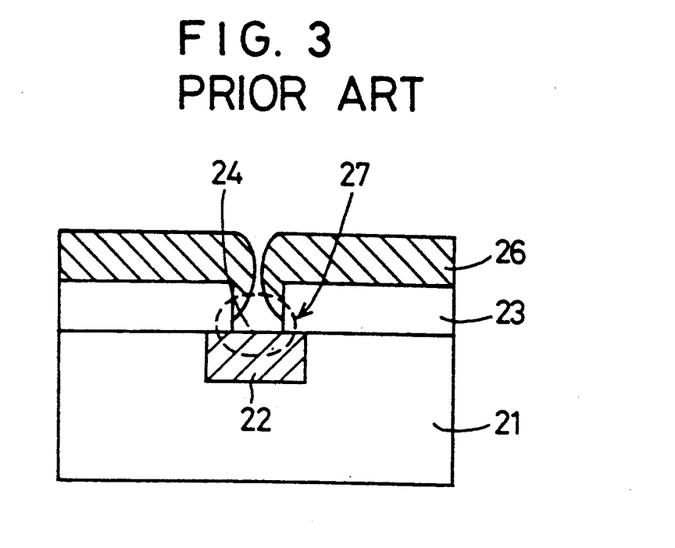
FIG. 3 is a diagram showing the problem in a contact hole made by a traditional method.

By a traditional method shown in FIG. 3, an N+ diffused layer 22 in which is diffused an N-type impurity element such as phosphorus, arsenic or antimony is formed in a silicon substrate 21, an insulating film 23 such as a silicon oxide film is formed thereon, and a contact hole 24 is formed therein in order to bring the N+ diffused layer 22 and an upper wiring layer 26 into contact with each other. When the size of the contact hole 24 becomes as small as 1 µm or less, it becomes very difficult to make a contact with the upper wiring layer. That is, the upper wiring layer 26 that is formed does not sufficiently enter the contact hole 24 and sufficient contact is not maintained between the N+ diffused layer 22 and the upper wiring layer 26. Furthermore, the contact hole 24 contains a region 27 in which the upper wiring layer 26 does not enter, i.e., contains a void. In order to improve these problems, there has been proposed a method that is shown in FIGS. 4(a) to 4(e).

Figure 4A:
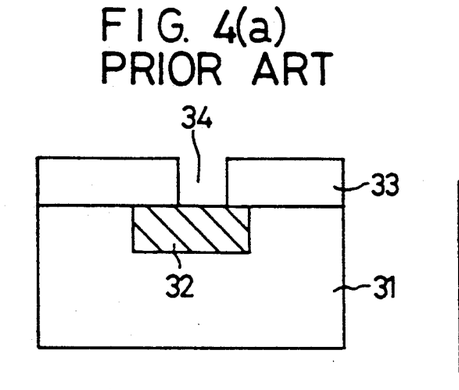
FIGS. 4(a)-4(e) are a sectional view illustrating the steps of a conventional method of manufacturing semiconductors.
Figure 4B:
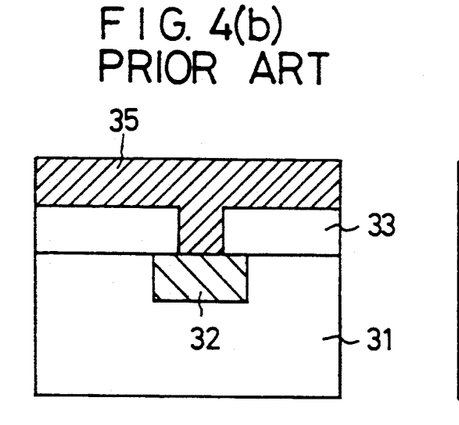
Figure 4C:
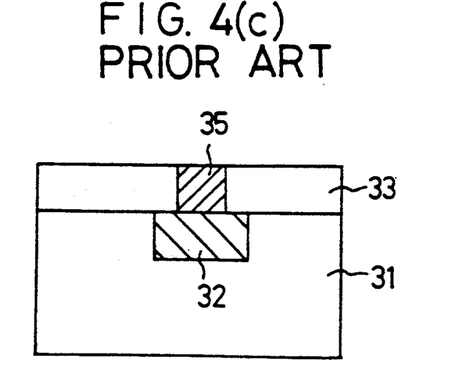
Figure 4D:
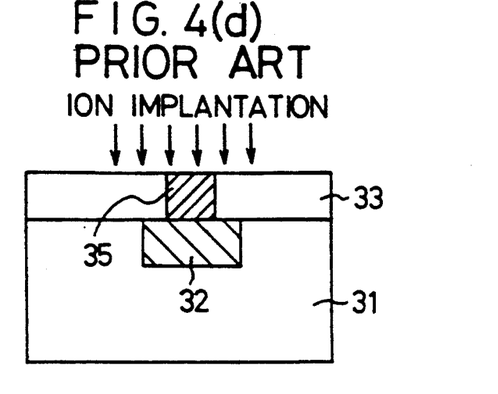
Figure 4E:
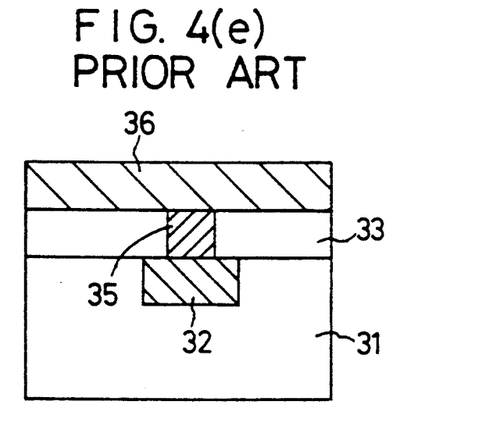

Referring to FIG. 4(a), first, an N+ diffused layer 32 is formed in a silicon substrate 31, an insulating film 33 is formed thereon, and a contact hole 34 is formed therein. Next, as shown in FIG. 4(b), a non-doped polycrystalline silicon film 35 is deposited to completely fill the contact hole 34. The polycrystalline silicon film is formed by a chemical vapor deposition method (CVD method) and accordingly has a good step-covering property, and is capable of sufficiently filling the contact hole even when its size is as small as 1 µm or less. Next, as shown in FIG. 4(c), the polycrystalline silicon film 35 is so etched back that the contact hole 34 only is filled with the polycrystalline silicon film 35. Then, as shown in FIG. 4(d), ions of N-type impurity element such as phosphorus (P), arsenic (As) or antimony (Sb) are implanted in order to introduce the N-type impurity element into the polycrystalline silicon film 35 that exists in the contact hole. Thereafter, heat treatment is carried out and, then, the upper wiring layer 36 is formed as shown in FIG. 4(e) maintaining the contact with the N+ diffused layer 32.

The problem to be solved by the method of FIG. 4 resides in the implantation of ions shown in FIG. 4(d). That is, in order to sufficiently lower the contact resistance with respect to the N+ diffused layer 32, the polycrystalline silicon film 35 must have a very low resistance. It therefore becomes necessary to implant the ions in a dosage of $1 \times 10^{16}/cm^2$ or greater, requiring a long period of time for ion implantation and an increased cost. Moreover, the contact hole 34 is deeper than 0.5 µm, and a large acceleration energy or a great load is required for implanting ions deep into the bottom of the polycrystalline silicon film 35. Moreover, though not shown in FIG. 4, a step of masking such as of photo-resist is necessary if it is not desired to implant ions into the regions other than the contact hole 34, resulting in a great increase in the number of steps and in the cost. Furthermore, the implantation of ions damages the semiconductor device to seriously affect its characteristics and reliability.

Moreover, when the insulating film 33 is an insulating film containing P-type impurity elements, for example, a silicon oxide film (BSB film) containing boron or a silicon oxide film (BPSG film) containing boron and phosphorous, the P-type impurity element may diffuse from the insulating film 33 into the polycrystalline silicon film 35 filled in the contact hole, resulting in an increase in the contact resistance, and making it necessary to further increase the dosage.

Figure 5:
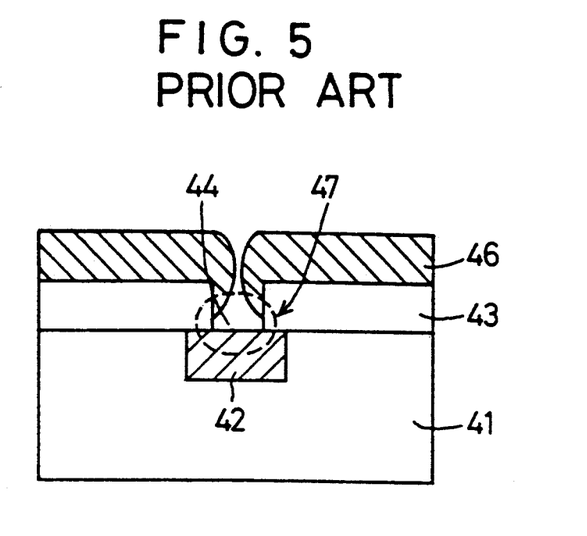
FIG. 5 is a diagram showing the problem in a contact hole made by a traditional method.

By a traditional method shown in FIG. 5, a P+ diffused layer 42 in which is diffused a P-type impurity element such as boron is formed in a silicon substrate 41, an insulating film 43 such as a silicon oxide film is formed thereon, and a contact hole 44 is formed therein in order to bring the P+ diffused layer 42 and an upper wiring layer 46 into contact with each other. When the size of the contact hole 44 becomes as small as 1 µm or less, it becomes very difficult to make a contact with the upper wiring layer. That is, the upper wiring layer 46 that is formed does not sufficiently enter the contact hole 44 and sufficient contact is not maintained between the P+ diffused layer 42 and the upper wiring layer 46. Furthermore, the contact hole 44 contains a region 47 which the upper wiring layer 46 does not enter, i.e., contains a void. In order to improve these problems, there has been proposed a method that is shown in FIGS. 6(a) to 6(e).

Figure 6A:
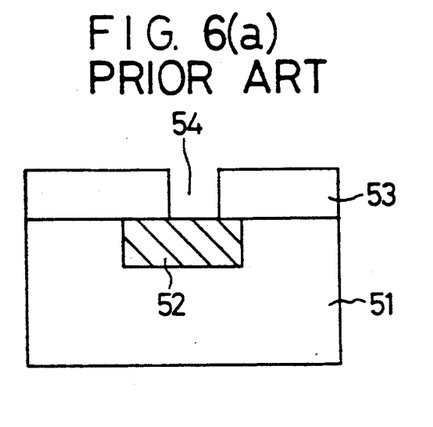
FIGS. 6(a)-6(e) are a sectional view illustrating the steps of a conventional method of manufacturing semiconductors.
Figure 6B:
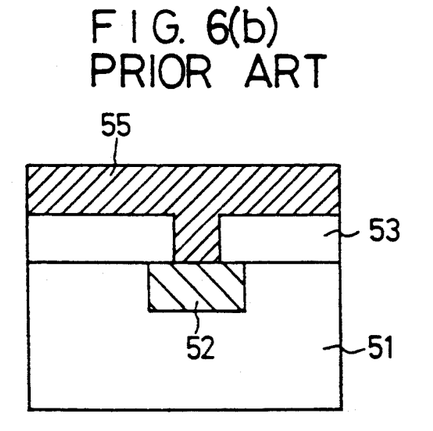
Figure 6C:
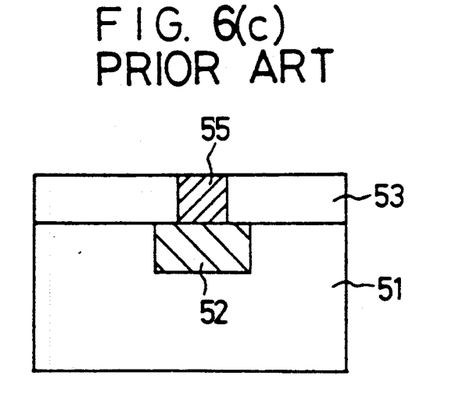
Figure 6D:
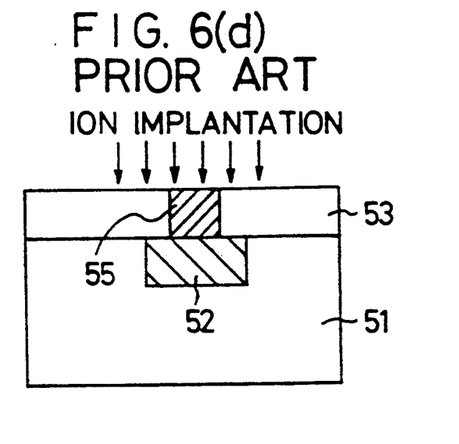
Figure 6E:
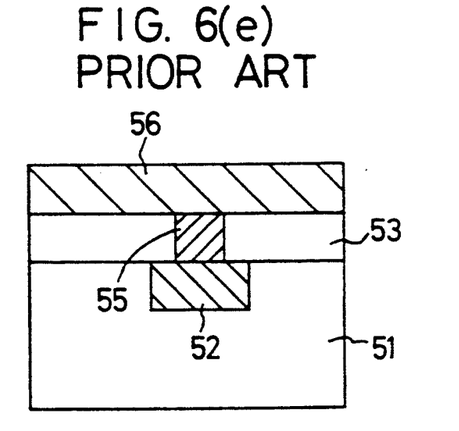

Referring to FIG. 6(a), first, a P+ diffused layer 52 is formed in a silicon substrate 51, an insulating film 53 is formed thereon, and a contact hole 54 is formed therein. Next, as shown in FIG. 6(b), a non-doped polycrystalline silicon film 55 is deposited to completely fill the contact hole 54. The polycrystalline silicon film is formed by the chemical vapor deposition method (CVD method) and accordingly has a good step-covering property, and is capable of sufficiently filling the contact hole even when its size is as small as 1 µm or less. Next, as shown in FIG. 6(c), the polycrystalline silicon film 55 is so etched back that the contact hole 54 only is filled with the polycrystalline silicon film 55. Then, as shown in FIG. 6(d), ions of P-type impurity element such as boron (B) are implanted in order to introduce P-type impurity element into the polycrystalline silicon film 55 that exists in the contact hole. Thereafter, the heat treatment is carried out and, then, the upper wiring layer 56 is formed as shown in FIG. 6(e) maintaining the contact with the P+ diffused layer 52.

The problem to be solved by the method of FIG. 6 resides in the implantation of ions shown in FIG. 6(d). That is, in order to sufficiently lower the contact resistance with respect to the P+ diffused layer 52, the polycrystalline silicon film 55 must have a very low resistance. It therefore becomes necessary to implant the ions in a dosage of $1 \times 10^{16}/cm^2$ or greater, requiring a long period of time for ion implantation and an increased cost. Moreover, the contact hole 54 is deeper than 0.5 µm, and a large acceleration energy or a great load is required for implanting ions deep into the bottom of the polycrystalline silicon film 55. Moreover, though not shown in FIG. 6, a step of masking such as of photo-resist is necessary if it is not desired to implant ions into the regions other than the contact hole 54, resulting in a great increase in the number of steps and in the cost. Furthermore, the implantation of ions damages the semiconductor device to seriously affect its characteristics and reliability.

Moreover, when the insulating film 53 is an insulating film containing N-type impurity elements, for example, a silicon oxide film (PSG film) containing phosphorus, a silicon oxide film (BPSG film) containing boron and phosphorus or a silicon oxide film (ASG film) containing arsenic, the N-type impurity element may diffuse from the insulating film 53 into the polycrystalline silicon film 55 filled in the contact hole, resulting in an increase in the contact resistance, and making it necessary to further increase the dosage of ion injection.

SUMMARY OF THE INVENTION

It is an object of the present invention to provide a method of manufacturing semiconductor devices comprising: a step of forming an N+ diffused layer in a semiconductor substrate, a step of forming an insulating film on the N+ diffused layer and an exposed face of semiconductor substrate, a step of forming a contact hole on the N+ diffused layer, a step of forming a film containing N-type impurities in the contact hole and on the insulating film, a step of etching the film containing N-type impurities from the upper side to fill the contact hole only with the film containing N-type impurities, and a step of forming an upper wiring layer on the film containing N-type impurities in the contact hole and on an exposed surface of the insulating film.

Another object of the invention is to provide a method of manufacturing semiconductor devices comprising: a step of forming a P+ diffused layer in a semiconductor substrate, a step of forming an insulating film on the P+ diffused layer and an exposed face of semiconductor substrate, a step of forming a contact hole on the P+ diffused layer, a step of forming a film containing P-type impurities in the contact hole and on the insulating film, a step of etching the film containing P-type impurities from the upper side to fill the contact hole only with the film containing P-type impurities, and a step of forming an upper wiring layer on the film containing P-type impurities in the contact hole and on an exposed surface of the insulating film.

A further object of the invention is to provide a method of manufacturing semiconductor devices comprising: a step of forming a P+ diffused layer and an N+ diffused layer in a semiconductor substrate, a step of forming an insulating film on the P+ and N+ diffused layers and an exposed face of semiconductor substrate, a step of forming a contact hole on the P+ diffused layer, a step of forming a film containing P-type impurities in the contact hole and on the insulating film, a step of etching the film containing P-type impurities from the upper side to fill the contact hole only with the film containing P-type impurities, a step of forming a second insulating film on an exposed face of the film containing P-type impurities which is filled in the contact hole, a step of etching the insulating film on the N+ diffused layer using a patterned photoresist film as a mask, a step of forming a second contact hole on the N+ diffused layer, a step of forming a film containing N-type impurities in the second contact hole, on the insulating film, and on the second insulating film, a step of etching the film containing N-type impurities from the upper side to fill the second contact hole only with the film containing N-type impurities, a step of removing the second insulating film on the film containing P-type impurities, and a step of forming on upper wiring layer on the films containing P and N-type impurities in the contact holes and on an exposed surface of the insulating film.

In order to solve the above-mentioned problems according to the present invention, the polycrystalline silicon film containing the N-type impurity element is formed by a CVD method, and is then so etched back that the contact hole is filled with the polycrystalline silicon film.

The polycrystalline silicon film filled in the contact hole contains N-type impurities in a concentration which is so high that the process of ion implantation is not required.

In order to solve the above-mentioned problems according to the present invention, the polycrystalline silicon film containing the P-type impurity element is formed by a CVD method, and is then so etched back that the contact hole is filled with the polycrystalline silicon film.

The polycrystalline silicon film filled in the contact hole contains P-type impurities in a concentration which is so high that the process of ion implantation is not required.

DETAILED DESCRIPTION OF THE PREFERRED EMBODIMENTS

Embodiment 1

Figure 1A:
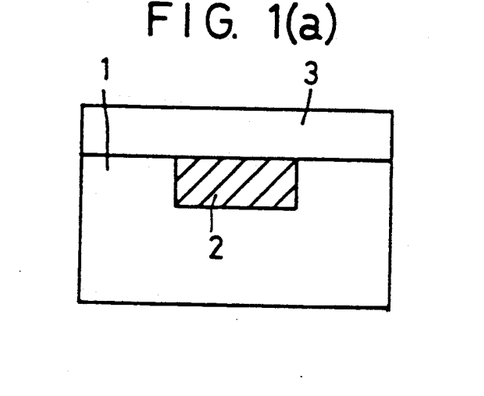
FIGS. 1(a)-1(e) are a sectional view illustrating the steps of a method of manufacturing semiconductor devices according to the present invention.

An embodiment of the present invention will now be described in detail in conjunction with FIG. 1. Referring to FIG. 1(a), an N+ diffused layer 2 which is an N-type impurity-diffused layer is formed in a silicon substrate 1 and, then, an insulating film 3 is formed. The insulating film 3 is a silicon oxide film ($SiO_2$), a silicon nitride film ($Si_3N_4$) or a silicon oxynitride film. Examples of the silicon oxide film include a non-doped silicon oxide film not containing impurities, a BSG film (boron silicate glass) containing boron (B), a PSG film (phosphorus silicate glass) containing phosphorus (P), or a BPSG film (boron phosphorus silicate glass) containing both boron (B) and phosphorus (P).

Figure 1B:
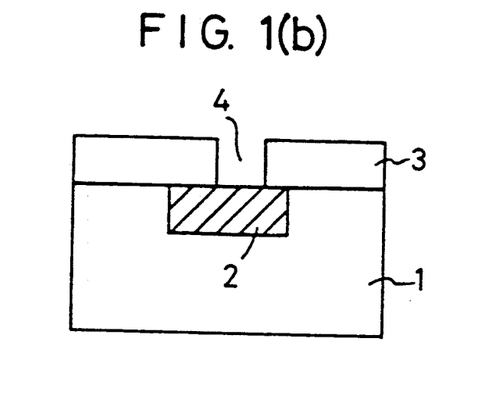

Next, as shown in FIG. 1(b), a contact hole 4 is formed on the N+ diffused layer 2. The contact hole 4 can be formed by either dry etching or wet etching. When the diameter or the length of one side of the contact hole 4 is smaller than 1 $\mu$m, the side wall of the contact hole is nearly vertical.

Figure 1C:
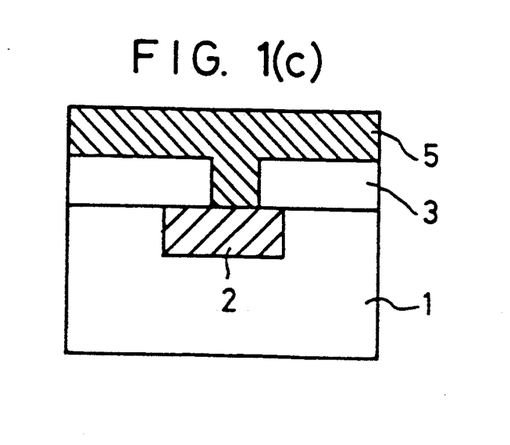

Referring next to FIG. 1(c), a polycrystalline silicon film or an amorphous silicon film 5 containing N-type impurities is formed by a chemical vapor deposition method. An example of such a method is such that a phosphine (PH$_3$) gas and a silane (SiH$_4$) gas are thermally decomposed at a temperature higher than 500° C. to form a polycrystalline silicon film or an amorphous film containing phosphorus (P) which is an N-type impurity. Another method is such that a phosphine (PH$_3$) gas and a silane (SiH$_4$) gas are decomposed at a temperature higher than ordinary temperature by a high-frequency plasma or a photoexcitation reaction to form a polycrystalline silicon film or an amorphous silicon film containing P. There is a further general method consisting of forming a polycrystalline silicon film containing N-type impurity or an amorphous silicon film containing the same by using a combination of a gas containing N-type impurity elements (P, As, Sb, etc.) and a gas for formation of silicon by thermolysis, plasma decomposition, or photolysis. As also shown in FIG. 1(c), the polycrystalline silicon film or amorphous silicon film 5 containing N-type impurities formed by a aforementioned chemical vapor-phase deposition method exhibits excellent step-covering property and is filled in the contact hole 4 even when the size of the contact hole 4 becomes 1 μm or smaller or 0.5 μm or smaller. Namely, the contact hole 4 does not include any void but can be completely filled with the film.

Figure 1D:
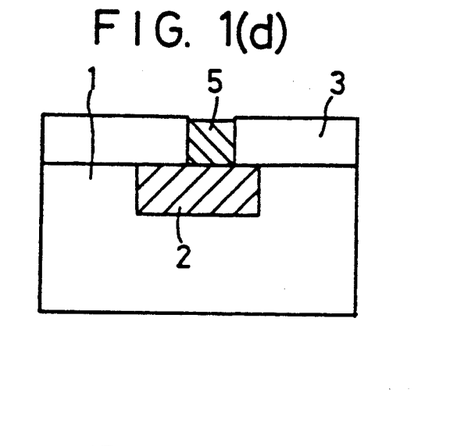

Referring next to FIG. 1(d), the polycrystalline silicon film or the amorphous silicon film 5 is etched from the upper side, so that the contact hole 4 only is filled with the polycrystalline silicon film or the amorphous silicon film 5. This makes it possible to very greatly decrease the step of the contact hole. This method is usually called etch-back method.

Figure 1E:
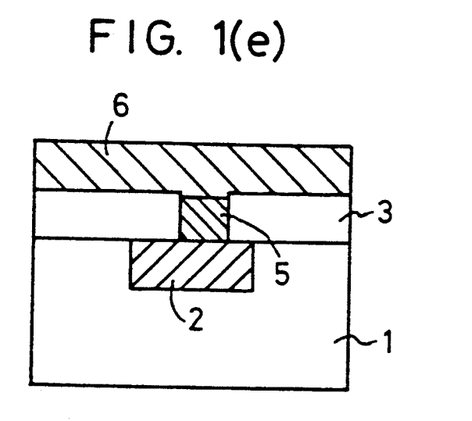

Then, an upper wiring layer 6 is formed as shown in FIG. 1(e). In this case, the contact hole 4 has such a small step that the upper wiring layer 6 is in good contact with the contact hole, and very good characteristics of the contact of the N+ diffused layer 2 and the polycrystalline silicon film 5 that is filled with the upper wiring layer 6 are obtained. Moreover, the upper wiring layer 6 exhibits very good step shape even in the contact hole 4. Therefore, neither the breakage in the wiring nor construction takes place near the contact hole 4, presenting advantage in yield and reliability.

FIGS. 1(a) to 1(e) illustrate only fundamental portions of the present invention. The intermediate steps of forming the semiconductor device are not illustrated. Needless to say, various steps such as heat treatment, oxidation, etching, formation of a film, etc. exist before and after or among the steps shown in FIGS. 1(a) to 1(e). For instance, a treatment with heat may be performed in order to remove the damage due to etching after the contact has been formed. Moreover, the upper wiring layer may be a polycrystalline silicon film, a silicide film, a metal film, or a multilayer film thereof. Furthermore, a treatment with heat may be carried out to activate N-type impurities in the polycrystalline silicon film in some step after the polycrystalline silicon film containing N-type impurities has been formed. A treatment with heat may further be carried out to taper the contact.

FIG. 1 illustrates the semiconductor device using a silicon substrate as the mother member. Obviously the present invention can also be adapted to semiconductor devices using other semiconductor substrates (such as of gallium arsenide (GaAs), germanium, diamond, compound semiconductor, etc.).

Moreover, though FIG. 1 is for illustrating the case of the N+ diffused layer, it is obvious that the present invention can further be adapted to even a wiring layer that includes N-type impurity elements. For instance, the present invention can be adapted even to contact holes on a polycrystalline silicon film which contains an N-type impurity element.

The present invention can further be adapted even to contact holes in the wiring layer which is made of a metal or a silicide, not in the N+ diffused layer.

Since the contact hole is filled with the polycrystalline silicon film that contains N-type impurities in a high concentration, the present invention exhibits the following effects:

(1) There is no need of implanting ions after the contact hole is filled with the polycrystalline silicon film.

(2) Use of the polycrystalline silicon film containing N-type impurities in a high concentration makes it possible to lower the resistance of the polycrystalline silicon film filled in the contact hole.

(3) It is allowed to lower the contact resistance between the N+ diffused layer and the upper wiring layer (with the polycrystalline silicon film sandwiched therebetween).

(4) The polycrystalline silicon film containing N-type impurities in a high concentration is formed by a CVD method, and exhibits good step-covering property (step coverage) and is completely filled in contact holes of even a size smaller than 1 μm.

(5) Optimization of the etch-back method makes it possible to decrease the step at the contact hole permitting the upper wiring layer to be in sufficient contact with the polycrystalline silicon film filled in the contact hole.

(6) Even when P-type impurities are diffused into the polycrystalline silicon film from the insulating film 3 that contains P-type impurities, the concentration of N-type impurities can be maintained great in the polycrystalline silicon film permitting neither the resistance of the polycrystalline silicon film to increase nor the contact resistance to increase.

Embodiment 2

Figure 2A:
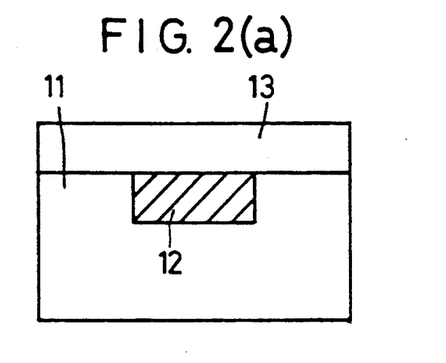
FIGS. 2(a)-2(e) are a sectional view illustrating the steps of a method of manufacturing semiconductor devices according to the present invention.

A second embodiment of the present invention will now be described in detail in conjunction with FIG. 2. Referring to FIG. 2(a), a P+ diffused layer 12 which is a P-type impurity-diffused layer is formed in a silicon substrate 11 and, then, an insulating film 13 is formed. The insulating film 13 is a silicon oxide film (SiO$_2$), a silicon nitride film (Si$_3$N$_4$) or a silicon oxynitride film. Examples of the silicon oxide film include a non-doped silicon oxide film not containing impurities, a BSG film (boron silicate glass) containing boron (B), a PSG film (phosphorus silicate glass) containing phosphorus (P), or a BPSG film (boron phosphorus silicate glass) containing both boron (B) and phosphorus (P).

Figure 2B:
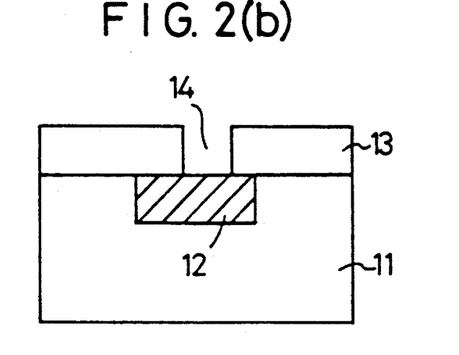

Next, as shown in FIG. 2(b), a contact hole 14 is formed on the P+ diffused layer 12. The contact hole 14 can be formed by either dry etching or wet etching. When the diameter or the length of one side of contact hole 14 is smaller than 1 μm, the side wall of the contact hole is nearly vertical.

Figure 2C:
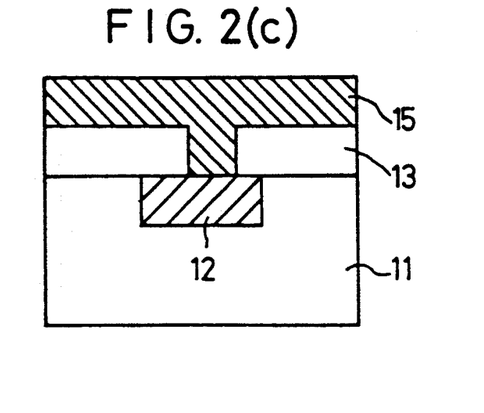

Referring next to FIG. 2(c), a polycrystalline silicon film or an amorphous silicon film 15 containing P-type impurities is formed by a chemical vapor deposition method. An example of such a method is such that a diborane (B$_2$H$_6$) gas and a silane (SiH$_4$) gas are thermally decomposed at a temperature higher than 500° C. to form a polycrystalline silicon film or an amorphous film containing boron (B) which is a P-type impurity. Another method is such that a diborane ($B_2H_6$) gas and a silane ($SiH_4$) gas are decomposed at a temperature higher than ordinary temperature by a high-frequency plasma or a photoexcitation reaction to form a polycrystalline silicon film or an amorphous silicon film containing B. There is a further general method of forming a polycrystalline silicon film containing P-type impurity or an amorphous silicon film containing the same by using a combination of a gas containing P-type impurity elements and a gas for formation of silicon by thermolysis or plasma decomposition. As also shown in FIG. 2(c), the polycrystalline silicon film or amorphous silicon film 15 containing P-type impurities formed by a aforementioned chemical vapor-phase deposition method exhibits excellent step-covering property and is filled in the contact hole 14 even when the size of the contact hole 14 becomes 1 μm or smaller or 0.5 μm or smaller. Namely, the contact hole 14 does not include any void but can be completely filled with the film.

Figure 2D:
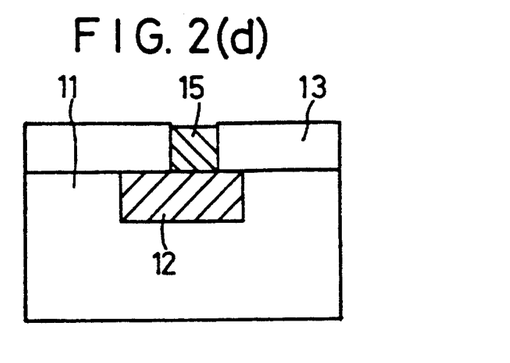

Referring next to FIG. 2(d), the polycrystalline silicon film or the amorphous silicon film 15 is etched from the upper side, so that the contact hole 14 only is filled with the polycrystalline silicon film or the amorphous silicon film 15. This makes it possible to very greatly decrease the step of the contact hole. This method is usually called etch-back method.

Figure 2E:
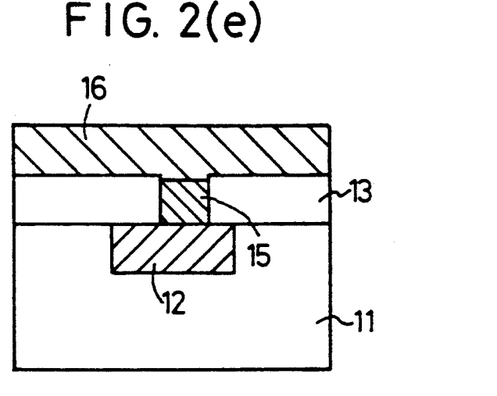

Then, an upper wiring layer 16 is formed as shown in FIG. 2(e). In this case, the contact hole 14 has such a small step that the upper wiring layer 16 is in good contact with the contact hole, and the P+ diffused layer 12, the polycrystalline silicon film 15 that is filled and the upper wiring layer 16, and the upper wiring layer 16 exhibit very good step shape even in the contact hole 14. Therefore, neither the breakage in the wiring nor construction takes place near the contact hole 14, presenting advantage in yield and reliability.

FIGS. 2(a) to 2(e) illustrate only fundamental portions of the present invention. The intermediate steps of forming the semiconductor device are not illustrated. Needless to say, various steps such as heat treatment, oxidation, etching, formation of a film, etc. exist before and after or among the steps shown in FIGS. 2(a) to 2(e). For instance, a treatment with heat may be performed in order to remove the damage due to etching after the contact has been formed. Moreover, the upper wiring layer may be a polycrystalline silicon film, a silicide film, a metal film, or a multilayer film thereof. Furthermore, a treatment with heat may be carried out to activate P-type impurities in the polycrystalline silicon film in some step after the polycrystalline silicon film containing P-type impurities has been formed. A treatment with heat may further be carried out to taper the contact.

FIG. 2 illustrates the semiconductor device using a silicon substrate as the motor member. Obviously the present invention can also be adapted to semiconductor devices using other semiconductor substrates (such as of gallium arsenide (GaAs), germanium, diamond, compound semiconductor, etc.).

Moreover, though FIG. 2 is for illustrating the case of the P+ diffused layer, it is obvious that the present invention can further be adapted to even a wiring layer that includes P-type impurity elements. For instance, the present invention can be adapted even to contact hole on a polycrystalline silicon film which contains a P-type impurity element.

The present invention can further be adapted even to contact holes in the wiring layer which is made of a metal or a silicade, not in the N+ diffused layer.

Since the contact hole is filled with the polycrystalline silicon film that contains P-type impurities in a high concentration, the present invention exhibits the following effects:

(1) There is no need of implanting ions after the contact hole is filled with the polycrystalline silicon film.

(2) Use of the polycrystalline silicon film containing P-type impurities at a high concentration makes it possible to lower the resistance of the polycrystalline silicon film in the contact hole.

(3) It is allowed to lower the contact resistance between the P+ diffused layer and the upper wiring layer (with the polycrystalline silicon film sandwiched therebetween).

(4) The polycrystalline silicon film containing P-type impurities at a high concentration is formed by a CVD method, and exhibits good step-covering property (step coverage) and is completely filled in contact holes of even a size smaller than 1 μm.

(5) Optimization of the etch-back method makes it possible to decrease the step at the contact hole permitting the upper wiring layer to be in sufficient contact with the polycrystalline silicon film filled in the contact hole.

(6) Even when N-type impurities are diffused into the polycrystalline silicon film from the insulating film 13 that contains N-type impurities, the concentration of P-type impurities can be maintained great in the polycrystalline silicon film permitting neither the resistance of the polycrystalline silicon film to increase nor the contact resistance to increase.

Embodiment 3

Figure 7A:
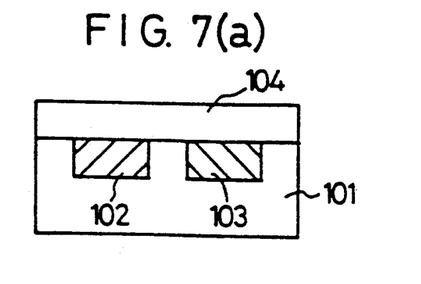
FIGS. 7(a)-7(h) are a sectional view illustrating the steps of a method of manufacturing semiconductor devices according to the present invention.

A third embodiment of the present invention will now be described in detail in conjunction with FIG. 7. Referring to FIG. 7(a), a P+ diffused layer 102 which is a P-type impurity-diffused layer and an N+ diffused layer 103 which is a N-type impurity-diffused layer are formed in a semiconductor substrate 101 and, then, an insulating film 104 is formed on the P+ and N+ diffused layers and an exposed face of semiconductor substrate 101. The insulating film 104 is a silicon oxide film ($SiO_2$), a silicon nitride film ($Si_3N_4$) or a silicon oxynitride film. Examples of the silicon oxide film include a non-doped silicon oxide film not containing impurities, a BSG film (boron silicate glass) containing boron (B), a PSG film (phosphorus silicate glass) containing phosphorous (P), or a BPSG film (boron phosphorus silicate glass) containing both boron (B) and phosphorus (P).

Figure 7B:
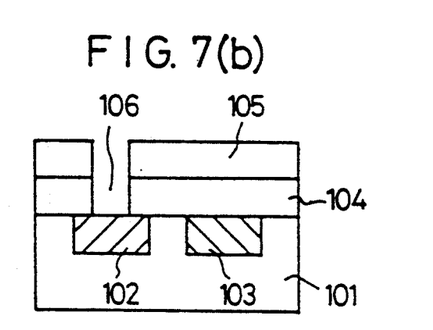

Next, as shown in FIG. 7(b), a part of an insulating film 104 is etched selectively, using a patterned photoresist film 105 as a mask and, then, a contact hole 106 is formed on the P+ diffused layer 102. The contact hole 106 can be formed by either dry etching or wet etching. When the diameter or the length of one side of the contact hole 106 is smaller than 1 μm, the side wall of the contact hole is nearly vertical.

Figure 7C:
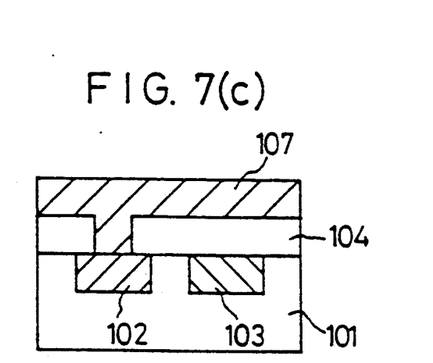

Referring next to FIG. 7(c), a film 107 containing P-type impurities is formed in the contact hole 106 and on the insulating 104 by a chemical vapor deposition method. The film 107 is a polycrystalline silicon film or an amorphous silicon film. An example of such a method is such that a diborane ($B_2H_6$) gas and a silane ($SiH_4$) gas are thermally decomposed at a temperature higher than 500° C. to form a polycrystalline silicon film or an amorphous film containing boron (B) which is a P-type impurity. Another method is such that a diboran ($B_2H_6$) gas and a silane ($SiH_4$) gas are decomposed at a temperature higher than ordinary temperature by a high-frequency plasma or a photoexcitation reaction to form a polycrystalline silicon film or an amorphous silicon film containing B. There is a further general method of forming a polycrystalline silicon film containing P-type impurity or an amorphous silicon film containing the same by using a combination of a gas containing P-type impurity elements and a gas for formation of silicon by thermolysis or plasma decomposition.

As also shown in FIG. 7(c), the polycrystalline silicon film 107 or amorphous silicon film 107 containing P-type impurities formed by the aforementioned chemical vapor deposition method exhibits excellent step-covering property and is filled in the contact hole 106 even when the size of the contact hole 106 becomes 1 μm or smaller or 0.5 μm or smaller. Namely, the contact hole 106 does not include any void but can be completely filled with the film 107.

Figure 7D:
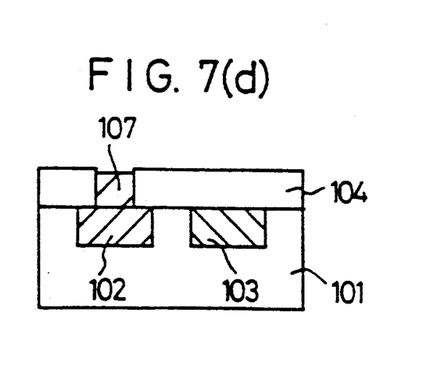

Referring next to FIG. 7(d), the film 107 is etched from the upper side, so that the contact hole 106 only is filled with the film 107.

Figure 7E:
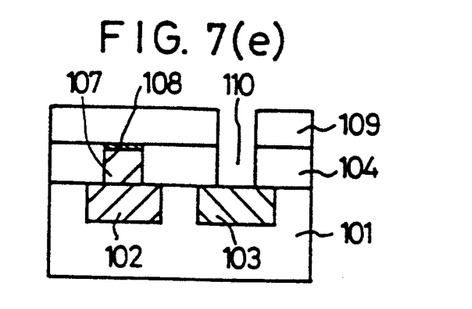

As shown in FIG. 7(e), an insulating film 108 covers the exposed face of the film 107 which is filled in the contact hole 106. A method of forming the insulating film 108 is a method of forming oxide film by oxidizing the face of the film 107 or a method of laminating a thin insulating film on the film 107 and the insulating film 104. After the insulating film 108 is formed on the film 107, the insulating film 104 is etched using a patterned photoresist film 109 as a mask and, then, a contact hole 110 is formed on the N+ diffused layer 103.

Figure 7F:
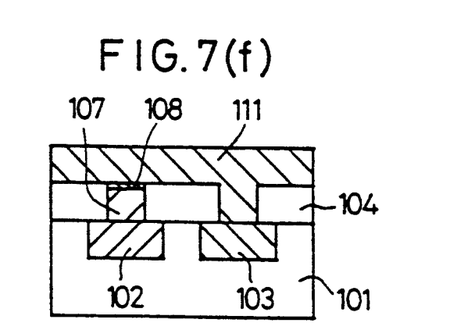

As shown in FIG. 7(f), a film 111 containing N-type impurities is formed in the contact hole 110 and on the insulating films 108 and 104 by a chemical vapor deposition method. The film 111 is a polycrystalline silicon film or an amorphous silicon film.

Figure 7G:
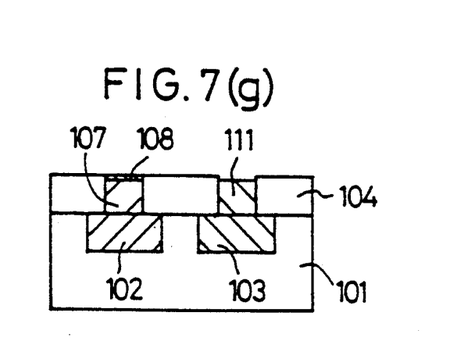

Referring next to FIG. 7(g), the film 111 is etched from the upper side, so that the contact 110 only is filled with the film 111.

Figure 7H:
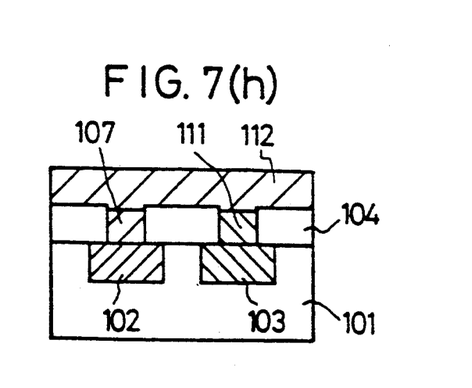

As shown in FIG. 7(h), an upper wiring layer 112 is formed on the film 107 and 111 and the insulating film 104 after the insulating film 108 is removed.

What is claimed is:

1. A method of manufacturing semiconductor devices, comprising the steps of:
   forming a P+ diffused layer and an N+ diffused layer in a semiconductor substrate;
   forming a first insulating film on the P+ and N+ diffused layers on an exposed face of semiconductor substrate;
   forming a contact hole on the P+ diffused layer;
   forming a film containing P-type impurities in the contact hole and on the first insulating film;
   etching the film containing P-type impurities from the upper side to fill the contact hole only with the film containing P-type impurities;
   forming a second insulating film on an exposed face of the film containing P-type impurities which is filled in the contact hole;
   etching the first insulating film on the N+ diffused layer using a patterned photoresist film as a mask;
   forming a second contact hole on the N+ diffused layer;
   forming a film containing N-type impurities in the second contact hole, on the first insulating film, and on the second insulating film;
   etching the film containing N-type impurities from the upper side to fill the second contact hole only with the film containing N-type impurities;
   removing the second insulating film on the film containing P-type impurities; and
   forming an upper wiring layer on the films containing P and N-type impurities in the contact holes and on an exposed surface of the first insulating film.

2. A method of manufacturing semiconductor devices as claims 1, wherein the film containing P-type impurities is formed by a chemical vapor deposition method.

3. A method of manufacturing semiconductor devices as claim 1, wherein the film containing N-type impurities is formed by a chemical vapor deposition method.

4. A method of manufacturing semiconductor devices as claim 1, wherein the film containing P-type impurities is a polycrystalline silicon film containing P-type impurities.

5. A method of manufacturing semiconductor devices as claim 1, wherein the film containing P-type impurities is an amorphous silicon film containing P-type impurities.

6. A method of manufacturing semiconductor devices as claim 1, wherein the film containing N-type impurities is a polycrystalline silicon film containing P-type impurities.

7. A method of manufacturing semiconductor devices as claims 1, wherein the film containing N-type impurities is an amorphous silicon film containing N-type impurities.

8. A method of manufacturing a semiconductor device, comprising the steps:
   forming a P+ layer and an N+ layer in a surface of a semiconductor substrate;
   forming a first insulating film on the P+ and N+ layers and on the surface of the semiconductor substrate;
   forming a contact hole through the first insulating film to expose the P+ layer;
   forming a film containing P-type impurities on the first insulating film and in the contact hole so as to completely fill the contact hole;
   removing the film containing P-type impurities from the first insulating film while leaving the film containing P-type impurities in the contact hole;
   forming a second insulating film on the exposed surface of the film containing P-type impurities which is in the contact hole;
   forming a second contact hole through the first insulating film to expose the N+ layer;
   forming a film containing N-type impurities on the first and second insulating films and in the second contact hole so as to completely fill the second contact hole;
   removing the film containing N-type impurities from the first and second insulating films while leaving the film containing N-type impurities in the second contact hole;
   removing the second insulating film; and
   forming a wiring layer on the exposed films containing P- and N-type impurities which are in the contact holes and on the exposed surface of the first insulating film.

9. A method according to claim 8; wherein the steps of removing the films containing P- and N-type impurities are carried out by etching.

10. A method according to claim 8; wherein the $P^+$ layer and the $N^+$ layer are formed by diffusion.

11. A method according to claim 8; wherein the film containing P-type impurities is formed by a chemical vapor deposition method.

12. A method according to claim 8; wherein the film containing N-type impurities is formed by a chemical vapor deposition method.

13. A method according to claim 8; wherein the film containing P-type impurities is a polycrystalline silicon film containing P-type impurities.

14. A method according to claim 8; wherein the film containing P-type impurities is an amorphous silicon film containing P-type impurities.

15. A method according to claim 8; wherein the film containing N-type impurities is a polycrystalline silicon film containing P-type impurities.

16. A method according to claim 8; wherein the film containing N-type impurities is an amorphous silicon film containing N-type impurities.

* * * * *